United States Patent
Campbell

[11] Patent Number: 6,122,440
[45] Date of Patent: Sep. 19, 2000

[54] OPTICAL HEATING DEVICE FOR RAPID THERMAL PROCESSING (RTP) SYSTEM

[75] Inventor: Stephen A. Campbell, Shoreview, Minn.

[73] Assignee: Regents of The University of Minnesota, Minneapolis, Minn.

[21] Appl. No.: 09/238,353

[22] Filed: Jan. 27, 1999

[51] Int. Cl.$^7$ ........................................ F21V 7/00
[52] U.S. Cl. .......................................... 392/420; 118/725
[58] Field of Search .................... 392/420, 411, 392/416, 422; 219/405, 411, 388, 460.1, 468.1; 438/796; 118/725; 362/237, 241, 247, 304; 250/295.1, 504 R

[56] References Cited

U.S. PATENT DOCUMENTS

| | | | |
|---|---|---|---|
| 3,623,712 | 11/1971 | McNeilly et al. | 118/725 |
| 4,550,245 | 10/1985 | Arai et al. | 219/405 |
| 4,694,143 | 9/1987 | Nishimura et al. | 219/388 |
| 5,155,336 | 10/1992 | Gronet et al. | 219/411 |
| 5,179,677 | 1/1993 | Anderson et al. | 392/411 |
| 5,253,324 | 10/1993 | Wortman et al. | 392/416 |
| 5,345,534 | 9/1994 | Najm et al. | 392/422 |
| 5,418,885 | 5/1995 | Hauser et al. | 392/416 |
| 5,446,824 | 8/1995 | Moslehi | 392/416 |
| 5,446,825 | 8/1995 | Moslehi et al. | 392/416 |
| 5,581,605 | 12/1996 | Murakami et al. | 378/84 |
| 5,715,361 | 2/1998 | Moslehi | 392/416 |
| 5,719,991 | 2/1998 | Sandhu et al. | 392/416 |
| 5,740,314 | 4/1998 | Grimm | 392/420 |

OTHER PUBLICATIONS

"Reflectors for Efficient and Uniform Distribution of Radiation for Lighting and Infrared Based on Non–Imaging Optics", by W. Cai et al., *SPIE*, vol. 1528, pp. 118–128, (1991).

"Thermal Processing: The RTP Race Heats Up", by P. Singer, *Semiconductor International*, pp. 64–70, (Mar. 1996).

*Primary Examiner*—Teresa Walberg
*Assistant Examiner*—Quang Van
*Attorney, Agent, or Firm*—Westman, Champlin & Kelly, P.A.

[57] ABSTRACT

An optical heating device for use in a rapid thermal processing (RTP) system includes a substrate having first and second sides. A plurality of lamps are arranged in generally coaxially circles on the first side of the substrate. An optical reflector portion is formed in the substrate adjacent the lamps and is configured and positioned to reflect light from the lamps toward an object to be heated. The reflector is formed as a trough in the substrate.

18 Claims, 3 Drawing Sheets

OPTICAL HEATING DEVICE FOR RAPID THERMAL PROCESSING (RTP) SYSTEM

BACKGROUND OF THE INVENTION

The present invention relates to rapid thermal processing (RTP) systems of the type used to fabricate integrated circuits and other electronic devices carried on substrates. More specifically, the present invention relates to an optical heating device for use in a rapid thermal processing (RTP) system.

Integrated circuits and many other electronic devices are built in and on semiconductor wafers and other round substrates. Many early fabrication systems processed batches of small diameter wafers. The wafer size has increased from 1.25 inches in diameter through today's conventional wafer of 200 mm diameter. Fabrication facilities are being designed around the newest wafer standard, 300 mm, with 450 mm wafers expected to be in production by the year 2007. As wafer sizes have increased, film thickness and feature sizes have decreased. In the most extreme case, microprocessors are now being fabricated in production with insulating layers that are approximately 10 atoms thick. Both the larger wafer size and the new process technology have put extreme uniformity and reproducibility requirements on the individual process tools. As a result, with only a few exceptions, process tools are shifting to single wafer reactors.

Since most process steps involve a chemical reaction and/or a film growth, some technique for controlling the temperature of the wafer, typically by a type of wafer heating, is almost always used in these process tools. Individual wafer heating is typically done optically in a process generically known as rapid thermal processing (RTP), or through resistively heated coils or pedestals which are placed in contact with a susceptor on which the wafer is mounted. Resistive heating arrangements suffer from a number of drawbacks. The wafer must beheld in contact with the susceptor. This produces unwanted particulate contamination. The newest technologies are sensitive to particles on both sides of the wafer, and so will find susceptor heating highly unacceptable. When used in conjunction with film deposition processes such as chemical vapor deposition and sputtering, the films accumulate on the heated susceptor, eventually flaking off when the film becomes sufficiently thick. Since the susceptor is hot, it can also outgas leading to memory effects and other unwanted contamination. Thermal uniformity in a resistively heated system often depends on the quality of the contact to the wafer. Variations lead to nonreproducible results. Finally the thermal mass of the susceptor necessitates slow heating and cooling, leading to long process times.

RTP systems have gone through a series of evolutionary improvements. An optical source is isolated from the chamber through a fused silica window which is sealed through the use of elastomer o-rings. This allows the operation of the light source in one atmosphere of air. Early RTP systems were built in two configurations. In the first a single high intensity source such as a high power xenon arc lamp, was used with a shaped reflector to produce an approximately uniform radiant field at the surface of the wafer. The light source while extremely intense and efficient, was difficult to operation and would age nonuniformly. As a result the thermal uniformity at the surface of the wafer would shift over time. The second configuration, which was popular for many years, involved the use of a reflecting cavity to distribute the radiation to the wafer. The wafer was loaded in a fused silica flow tube. Linear filament lamps were arranged above and below the flow tube to act as a heat source. The flow tube and lamps were enclosed in a reflecting box, typically gold plated aluminum or stainless steel. The surface of the cavity was often roughened to randomize the direction of the reflected light rays. Once again, the intention was to produce a uniform radiant field at the surface of the wafer.

Both types of systems suffer from a common deficiency. When a nominally uniform radiant intensity is applied to the top of the wafer, the edges of the wafer were found to be significantly cooler than the center. The reasons for this radial temperature radiant include a variation of the optical view factor (and therefore radiant intensity) across the surface of the wafer, the lack of optical energy directed toward the sides of the wafer, and natural convection in the chamber which tends to overcool the wafer edges. In the later versions of the single lamp system, these effects were sometimes compensated by selectively frosting the fused silica window to scatter some of the light that would otherwise reach the center of the wafer. The temperature variation, however, was not constant. It depended on the process temperature, the optical properties of the wafer, and the gas conditions inside the reactor. Thus the single source system could only optimize for one set of conditions. The reflecting cavity approach to RTP compensated for edge effects by increasing the power density to the lamps near the perimeter of the wafer. Typically the upper and lower lamp banks were arranged perpendicular to each other and parallel to the lane of the wafer. Thus, the extra radiation was distributed in a square about the round wafer, with two side of the square above the wafer and two sides below the wafer. By varying the power distribution between the majority of the lamp array and these edge lamps, one could compensate for edge effects over a range of process conditions.

While the reflecting cavity was widely used for 100 mm to 150 mm wafers, the technique did not have sufficient uniformity to be used with 200 mm systems. For this type of system a more refined zone heating system would be required. The goals of this zone heating are as follows: 1) to collect as much light from the lamps as possible; 2) to be able to distribute that light in circular zones that can be independently controlled to be able to obtain a uniform temperature across the surface of the wafer; and 3) to be as insensitive as possible to lamp to lamp variations in optical conversion efficiency. The latter point is quite important as lamp outputs can vary by as much as 20% as received. After operation, the lamp aging further increases this disparity.

One system that falls into this category is described in U.S. Pat. No. 5,446,825 by Moslehi et al. in which much shorter, single-sided filament lamps penetrate the reflector. Flat sided rings are machined into the reflector to direct some of the light corresponding rings on the surface of the wafer. By arranging the wafers into these circular rings, the light from several lamps is effectively averaged, and so the system is less sensitive to lamp to lamp variation. Collection efficiency was only moderate however. A 100 mm system typically requires ~50 kW of energy, well in excess of that required for a reflecting cavity design. A 200 mm system requires ~200 kW.

A second type of zone heated RTP system, now in widespread production for use at 200 mm wafers and beyond, uses an array of lamps, each of which has an individual reflector to collect the light and direct it to the surface of the wafer. This arrangement is sometimes called a spotlight system. Groups of lamps, in roughly the shape of concentric rings, are run in parallel from 3 to 5 power supplies to be able to control the radiant power distribution across the wafer. This type of system has a high collection efficiency, and allows the use of the zone heating technique, but requires careful lamp matching and frequent lamp changes to ensure the necessary uniformity. A typical system requires 137 kW lamps to hear a 200 mm wafer. 200 mm systems are expected to require close to 300 lamps.

While spotlight systems have achieved a great deal of success systems used to primarily to thermally anneal and/or oxidize the wafer, the technique is generally prohibitively expensive and too complicated to operate to be used as a heat source for other processes. Typical spotlight annealing systems are very expensive and require frequent lamp change outs using vendor qualified (i.e., presorted) lamps. As a result, very few equipment vendors have chosen to use the spotlight system for heating wafers in non-annealing processes. Finally both of the zone heating systems described above were designed to heat wafers to temperatures in excess of 1100° C. to anneal implanted impurities in the semiconductor wafer. Most non-annealing processes are run at temperatures well below 700° C. Power requirements for these lower temperature processes are at least four times lower than conventional implant annealing. Operating the heater in this low power regime further degrades the lamp as the operating power is too low to activate the halogen cycle of lamps.

Thus there is a need for a much lower cost version of a multizone lamp module that can heat a semiconducting wafer using cylindrical symmetry. This could be used for low and moderate temperature processes (temperatures less than or equal to 800° C.), including those operations such as plasma assisted processes, where wafer heating plays a supplementary role. The heating arrangement should have a high collection efficiency to minimize operating costs and should allow the overlapping output of multiple lamps in a zone to avoid the localized hot spots that spotlight systems are prone to.

SUMMARY OF THE INVENTION

An optical heating device for use in a rapid thermal processing (RTP) system includes a substrate having first and second sides. A plurality of lamps are arranged in generally coaxially circles on the first side of the substrate. An optical reflector portion is formed in the substrate adjacent the lamps and is configured and positioned to reflect light from the lamp generally toward an object to be heated.

DETAILED DESCRIPTION OF THE PREFERRED EMBODIMENTS

Figure 1:
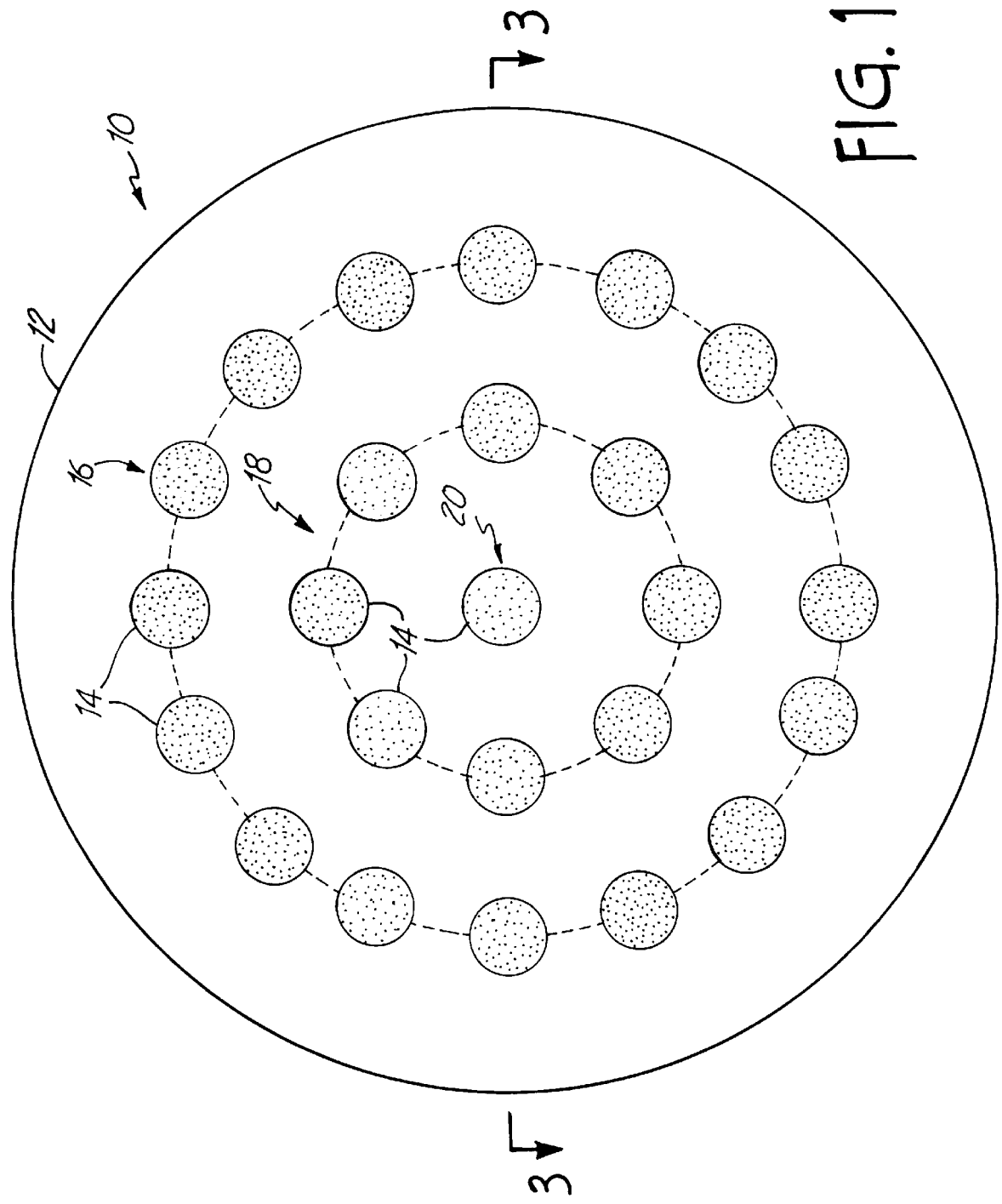
FIG. 1 is a top plan view of an optical heating device including a disc in accordance with the present invention.

This present invention includes a low cost, multizone system for heating cylindrically symmetric substrates such as semiconductor wafer, in a variety of processing systems. In one embodiment, the system is not designed to produce temperatures over 800° C., however, the system can be constructed and maintained at much lower costs than the prior art optical heating systems which were designed for much higher temperature operation.

In one embodiment, the lamps in the present invention are distributed alone several circles that are coaxial with the wafer to be heated. To efficiently collect the light and direct it to the surface of the wafer, the lamps lie in a series of annular troughs. The cross sections of these troughs may be shaped parabolically or near parabolically. The reflecting shapes may also be canted into or away from the center of the wafer to focus or defocus the light. The use of these troughs significantly improves the thermal uniformity of the design in comparison to prior art systems such as that set forth in U.S. Pat. No. 5,446,825. Furthermore the present reflector is far simpler to construct and does not require the prior art radiation baffles. This reflector may be cooled by natural or forced convection, or by the use of a cooling fluid such as water. The lamps will be electrically contacted through an annular series of lamp sockets. Each zone, except perhaps for the center zone which may be heated by a single lamp on the central axis of the system, typically contains a number of these sockets.

Since typical optical conversion efficiencies for halogen lamps are less than 50%, cooling of the lamp/reflector assembly is an important part of the design. The reflector itself may be cooled by natural or forced convection, or by the use of a cooling fluid such as water. Gold or other highly reflective and chemical inert coatings can be used to retard corrosion of the reflector while it is warm. The primary lamp failure mechanism is the formation of air leaks at the seal between the glass envelope and the metal base. The air leak leads to a rapid oxidation and subsequent failure of the hot filament. Typically, this leak arises from repeated thermomechanical stresses due to lamp heating. Prior art designs have used heat conduction through the power leads, and in some cases forced convection over the glass envelope to cool the lamps. In this design, the lamps are cooled by providing metal to metal contact between the metal base of the lamp and the cooled reflector. Thermal conduction through this metal base is far more effective than either forced convection or conduction from the leads in keeping the glass to metal seal cool. AS a result longer lamp life and/or higher output power is available.

The light from the lamp modules and reflector can be directed toward a wafer, which resides in a process chamber, through a window. This window may be fused silica, quartz, sapphire, or other material which is sufficiently transparent in the visible and near IR portion of the electromagnetic spectrum. Both sides of the wafer could be heated with such lamp modules if increased temperature or increased vertical uniformity are required. With two sided heating temperatures approaching 1000° C. would be available.

The optical heating system of the invention produces a series of rings of light on the surface of the wafer. Light in each of these rings can be partially defocused to allow some overlap and spread. By controlling the electrical power to the lamps in each trough, the intensity of these rings can be independently controlled. Power settings may be determined through a look up table derived from the design of the system, or may be in response to sensors positioned to detect the temperature at various radii from the center of the wafer. The number of circular zones depends on the size of the wafer to be heated and the granularity of control desired, but would commonly be between 3 and 5. Similarly, the number of lamps in each trough depends on the power density that is required. Excellent thermal uniformity is achieved on a 300 mm wafer using three zones containing 1, 8 and 16 lamps, respectively. A higher power version can easily be made with 1, 12 and 24 lamps in the same three trough heater. Although the central zone may consist of a single lamp, it can be controlled by its own power supply and would thus be immune from the problems associated with nonuniform optical conversion efficiency.

By varying the power distribution across the wafer, one can ensure the desired temperature profile during both steady state and transient cycles. Often this is a uniform profile, however, one might also wish to ramp the temperature across the wafer to compensate for gas depletion or other process nonuniformities. Thus the present invention is more efficient than the system of U.S. Pat. No. 5,446,825 and less expensive to build and operate than prior art spot light systems. Unlike either of these two, the present invention is well suited for low and moderate temperature heating (less than 800° C.) and is may be used as a "workhorse" heating system to be integrated into a wide variety of semiconductor processing tools.

FIG. 1 is a top plan view of a optical heating device 10 in accordance with the present invention which includes a disc 12. A series of lamp apertures 14 are formed in two concentric circles 16 and 18 about a center lamp aperture 20. In the specific embodiments shown, circle 18 includes eight lamp apertures substantially evenly spaced and circle 16 includes 16 lamp apertures substantially evenly spaced.

Figure 2:
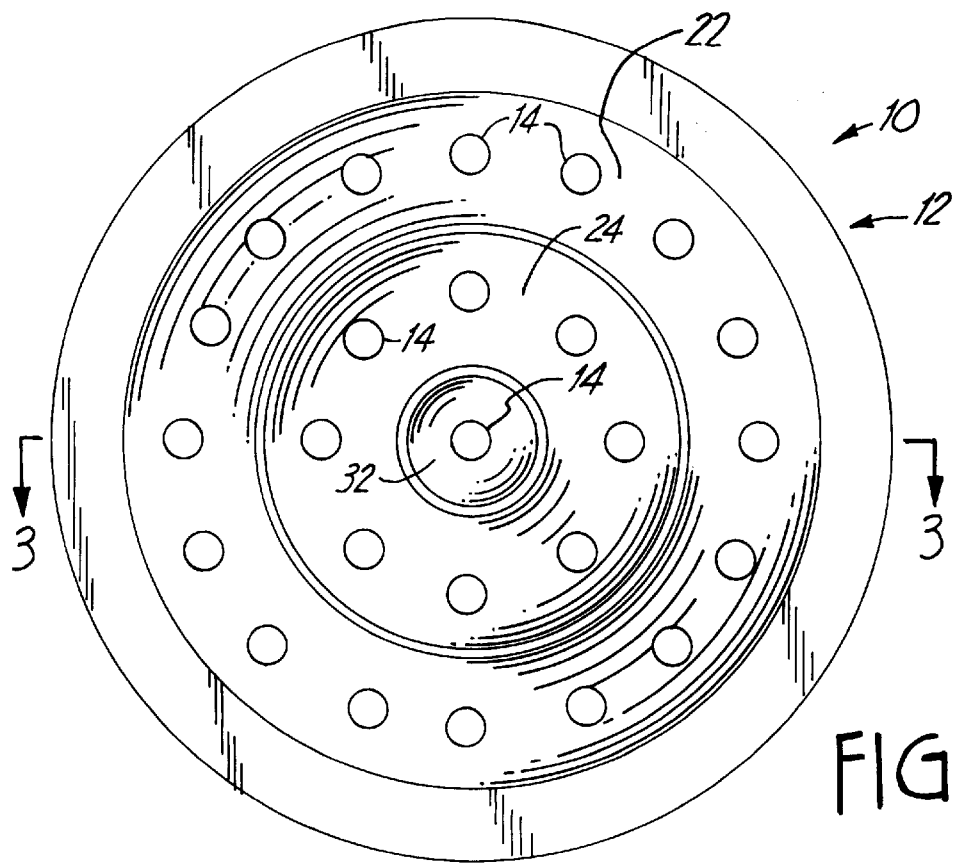
FIG. 2 is a bottom plan view of the disc of FIG. 1.

FIG. 2 is a bottom plan view of disc 12 showing apertures 14 carried in an outer trough 22, an inner trough 24, and a center "trough" 32. Apertures 14 extend completely through disc 12.

Figure 3:
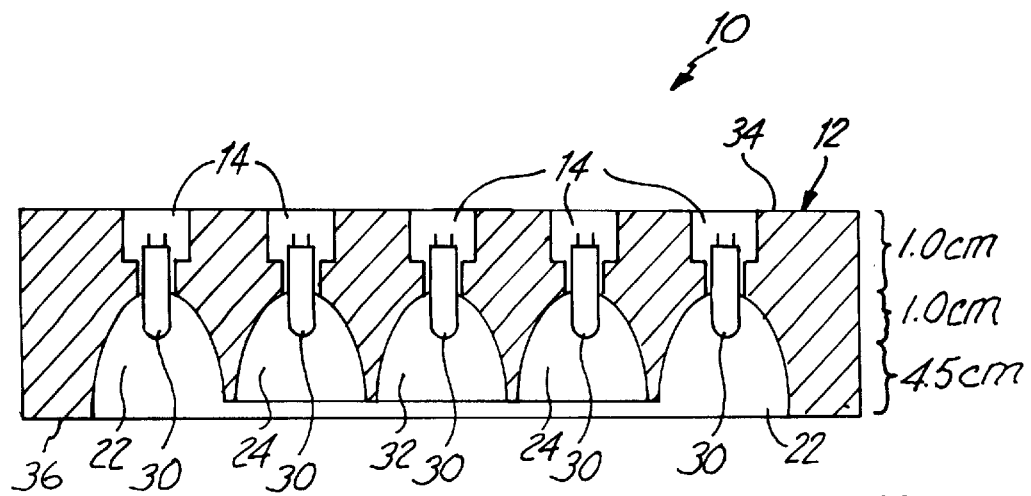
FIG. 3 is a cross-sectional view of the disc of FIGS. 1 and 2 taken along the lines labelled 3—3.

FIG. 3 is a side cross sectional view of disc 12 taken along the lines labelled 3—3 in FIGS. 1 and 2. FIG. 3 also shows lamps 30 placed in troughs 22 and 24 and center reflector or "trough" 32. Lamps 30 are carried in apertures 14 which extend from a top side 34 of disc 12 to a bottom side 36. FIG. 3 also shows an alignment hole 40 which is used for mounting and aligning disc 12.

In one embodiment, disc 12 has a diameter of about 15 inches and is made of aluminum. The trough depths are about 4.5 cm and are defined by Equation 1:

$$z = 0.5(r - r_0^2) \qquad \text{Eq. 1}$$

where $r_0$ is 0 cm, 6.04 cm, or 12.08 cm and r ranges from 0–2.967 cm, 3.07–9.01 cm and 9.11–15.10 cm. Lamp apertures 14 are divided into two 1 cm sections, one section for holding the tip portion of a lamp 30 and one for holding a base portion of a lamp 30. In one preferred embodiment, lamps 30 comprise 1000 W tungsten halogen lamps available from Ushio America, Inc. located in Cypress, Calif. Lamp apertures 14 have a diameter of 0.75" for the bulb, with a 0.875 clearance hole for the base. In one preferred embodiment, troughs 22, 24 and 32 are coated with a reflective material such as gold.

Figure 4:
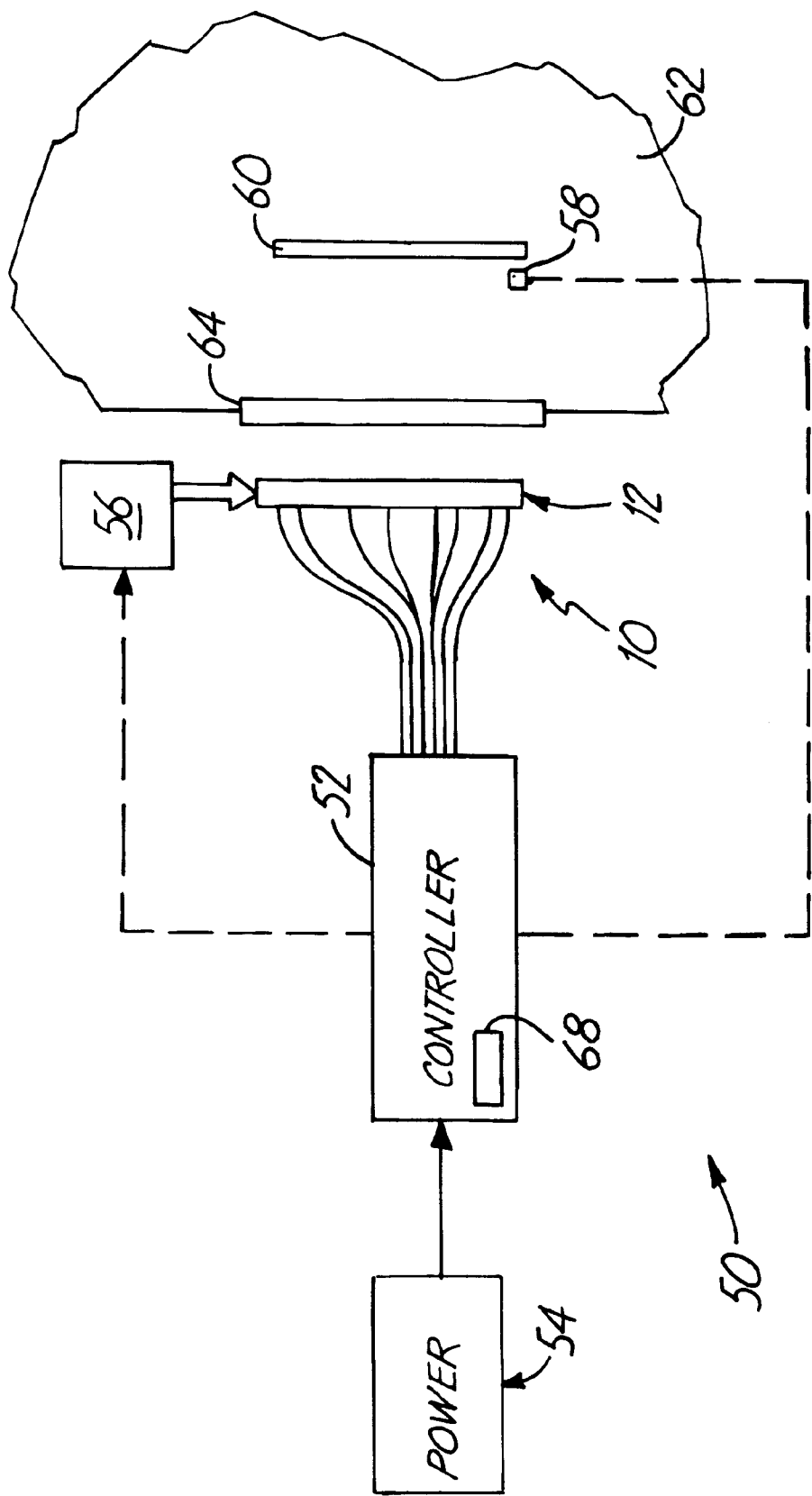
FIG. 4 is a simplified diagram of a rapid thermal processing (RTP) system in accordance with the present invention.

FIG. 4 shows a rapid thermal processing system 50 in accordance with the present invention utilizing optical heating device 10. Lamps 30 carried in disc 12 are coupled to a controller 52 which receives power from a power source 54. Controller 52 may be coupled to a cooling device 56 which may be used to cool disc 12 such as through the application of cold water. Controller 52 is also optionally coupled to a heat or light sensor(s) 58 positioned near an object 60 which is to be heated. Object 60 is carried in a process chamber 62 proximate a transparent window 64 which is located between device 10 and object 60.

In operation, controller 52 applies power to lamps 30 carried in disc 12. The power applied to individual lamps may vary as desired to achieve a desired heat distribution on object 60. Further, the parabolas of troughs 22, 24 and 32 may be tilted relative to the axis of disc 12, or disc 12 may be tilted, as desired to change the light distribution across object 60 and thereby change the heating profile. Cooling apparatus 56 may be used to cool disc 12 to thereby remove heat generated by lamps 30. Controller 52 monitors the heat or the optical energy applied to disc 60 using sensor(s) 58 and may responsively control lamps 30. Further, multiple sensor 58 may be used such that controller 52 can change the heating profile across the surface of object 60. Window 64 may comprise, for example, fused silica, quartz, sapphire or other material which is transparent to visible and near infrared light. A second disc 12 may be used to illuminate the opposite side of object 60. The desired power setting for each lamp 30 carried in disc 12 may be stored in a look up table 68 stored in controller 52.

Disc 12 may be fabricated using any appropriate technique such as simple machining techniques.

Although the present invention has been described with reference to preferred embodiments, workers skilled in the art will recognize that changes may be made in form and detail without departing from the spirit and scope of the invention. For example, the shapes of the troughs may be other than those specifically set forth herein. Further still, the number of troughs, spacing, number of lamps, lamp types, materials, etc. may be changed to obtain a desired power level, distribution pattern or other system characteristics.

What is claimed is:

1. An optical heating device for use in a system of the type used to heat an object, comprising:

a substrate having first and second sides, the first side having a substantially flat surface;

a plurality of lamps arranged in generally coaxial circles on the first side of the substrate; and an optical reflector formed in the substrate adjacent the lamps, the reflector positioned to reflect light from a lamp generally toward the object, the reflector comprising a plurality of coaxial circular continuous troughs each forming an annulus in the flat surface of the substrate, the lamps positioned in the troughs and the troughs having a depth extending in a direction from the first surface toward the second surface.

2. The optical heating device of claim 1 wherein the optical reflector formed in the substrate comprises a plurality of substantially coplanar and coaxially troughs.

3. The optical heating device of claim 1 wherein the trough has a substantially parabolic cross section taken through a radius of the trough.

4. The optical heating device of claim 1 wherein the optical reflector portion has a substantially parabolic cross section.

5. The optical heating device of claim 1 wherein the optical reflector portion is coated with an optically reflective material.

6. The optical heating device of claim 2 including a central reflector positioned centrally relative to the coaxial troughs.

7. The optical heating device of claim 1 wherein the plurality of lamps are carried in a hole formed in the optical reflector portion.

8. The optical heating device of claim 1 wherein the plurality of lamps comprise halogen lamps.

9. The optical heating device of claim 2 wherein the coaxial troughs are substantially coplanar.

10. The optical heating device of claim 1 wherein the optical reflector portion is arranged to focus light from the lamp in a direction which is at an angle relative to a plane of the optical reflector portion.

11. The optical heating device of claim 1 wherein the optical reflector is configured to reflect light from a first side and from a second side of the lamp toward the object.

12. The optical heating device of claim 11 wherein the first side of the lamp is opposite the second side of the lamp.

13. The optical heating device of claim 12 wherein the first side of the lamp is positioned closest to a center of the coaxially circles and the second side of the lamp is positioned furthest away from the center of the coaxially circles.

14. The optical heating device of claim 1 wherein the substrate comprises a disc.

15. A rapid thermal processing (RTP) system including an optical heating device according to claim 1.

16. The optical heating device of claim 1, wherein the reflector provides a plurality of highly uniform illuminated zones and has a high collection efficiency.

17. The optical heating device of claim 2 wherein troughs are created to control illumination intensely while maintaining illumination uniformly.

18. The optical heating device of claim 1 including a metal to metal contact between the substrate and reflector portion to promote heat transfer from the reflector.

* * * * *

UNITED STATES PATENT AND TRADEMARK OFFICE
CERTIFICATE OF CORRECTION

PATENT NO. : 6,122,440
DATED : September 19, 2000
INVENTOR(S) : Stephen A. Campbell It is certified that error appears in the above-identified patent and that said Letters Patent is hereby corrected as shown below:

Title Page,

Under item [56] References Cited
U.S. PATENT DOCUMENTS ADD THE FOLLOWING: --

| | | | |
|---|---|---|---|
| 3,761,678 | 9/1973 | Eckles.......... | 392/411 |
| 4,752,592 | 6/1988 | Tamura et al..... | 438/796 |
| 5,443,315 | 8/1995 | Lee et al........ | 374/126 |
| 5,487,127 | 1/1996 | Gronet et al..... | 392/416 |
| 5,551,985 | 9/1996 | Brors et al...... | 118/725 -- |

Signed and Sealed this

Seventh Day of August, 2001

*Attest:*

NICHOLAS P. GODICI
*Attesting Officer*  *Acting Director of the United States Patent and Trademark Office*